(12) United States Patent
Hoogzaad

(10) Patent No.: US 8,471,637 B2
(45) Date of Patent: Jun. 25, 2013

(54) VARIABLE GAIN AMPLIFIER

(75) Inventor: Gian Hoogzaad, Mook (NL)

(73) Assignee: NXP B.V., Eindhoven (NL)

( * ) Notice: Subject to any disclaimer, the term of this patent is extended or adjusted under 35 U.S.C. 154(b) by 30 days.

(21) Appl. No.: 13/368,372

(22) Filed: Feb. 8, 2012

(65) Prior Publication Data

US 2012/0206205 A1 Aug. 16, 2012

(30) Foreign Application Priority Data

Feb. 16, 2011 (EP) ..................................... 11154608

(51) Int. Cl.
*H03G 3/10* (2006.01)
(52) U.S. Cl.
USPC .......................................... 330/284; 330/278
(58) Field of Classification Search
USPC ............................ 330/284, 278, 310, 150, 98
See application file for complete search history.

(56) References Cited

U.S. PATENT DOCUMENTS

| | | | |
|---|---|---|---|
| 3,671,886 A * | 6/1972 | Fudemoto et al. ............... | 333/18 |
| 4,132,957 A * | 1/1979 | Hekimian et al. ............... | 330/51 |
| 5,049,841 A | 9/1991 | Cooper et al. | |
| 6,271,722 B1 | 8/2001 | Ballantyne | |
| 6,836,184 B1 * | 12/2004 | Daughtry et al. ............. | 330/144 |
| 8,098,094 B2 * | 1/2012 | Gilbert ........................... | 330/144 |
| 2006/0128334 A1 | 6/2006 | Ikuta et al. | |

OTHER PUBLICATIONS

RF Manual 14th Edition, NXP Semiconductors, cover, pp. 4-13, 62, 73, end page (May 2010).
BGA7210, product data sheet, NXP Semiconductors, 30 pgs. (Jan. 2012).
Extended European Search Report for EP Patent Appln. No. 11154608.1 (Jul. 25, 2011).

* cited by examiner

*Primary Examiner* — Henry Choe

(57) ABSTRACT

The invention relates to a variable gain amplifier comprising a first attenuator (1) for receiving an input signal (rf_in) and for transmitting a first attenuated input signal to a first amplifier (2) for amplifying the first attenuated input signal and for generating a first amplified signal to a second attenuator (3) for attenuating the first amplified signal and for transmitting a second attenuated signal to a second amplifier (4) for amplifying the second attenuated signal and for generating an output signal (rf_out). The first attenuator (1) is supplied from a first supply voltage source (10). The second attenuator (3) is supplied from a second supply voltage source (30). The first amplifier (2) is supplied from a third supply voltage source (20), and the second amplifier (4) is supplied from a fourth supply voltage source (40).

9 Claims, 3 Drawing Sheets

VARIABLE GAIN AMPLIFIER

CROSS-REFERENCE TO RELATED APPLICATIONS

This application claims the priority under 35 U.S.C. §119 of European patent application no. 11154608.1, filed on Feb. 16, 2011, the contents of which are incorporated by reference herein.

FIELD OF THE INVENTION

The invention relates to variable gain amplifier.

BACKGROUND OF THE INVENTION

Variable gain amplifiers (VGAs) are used inter alia in receiving and transmitting paths of basestations for conditioning the amplitude of a Radio Frequency (RF) signal for various gain variations as signal level at the antenna or gain spread of the electrical components.

In the RF spectrum ranging from 0.7 GHz to 3.8 GHz it is very necessary to keep an almost constant and linear amplification with a signal to noise ratio as large as possible. These tasks are not trivial to achieve when such a large frequency range is involved.

Known prior art VGA amplifiers comprise a series connection of a small signal amplifier followed by an attenuator and further followed by a large signal amplifier. However, this known architecture generates intermodulation noise, the attenuator being hard to adapt to the amplifiers impedances in whole frequency range. An important parameter of any VGA is OIP3 i.e. third order intercept point (IP3) at the output. This is a measure for the small-signal third order linearity of the circuit. The OIP3, expressed in dBm, indicates the extrapolated power level at which the first harmonic has the same power as the third harmonic at the output.

The overall OIP3 at maximum gain of the VGA is limited by the OIP3 of large signal amplifier in a power amplifier as described above. This is no surprise because said amplifier should handle the largest signals in the circuit. It should also be seen that, at maximum attenuation, the OIP3 is fully determined by the small signal amplifier and the attenuator.

The problem with this OIP3 situation is twofold
1. the linearity at maximum attenuation is too low (18.4 dBm, see FIG. 1)
2. the linearity is not constant over attenuation and heavily dependent on the attenuation setting.

SUMMARY OF THE INVENTION

Hence, it is a need, to improve the noise figure and the linearity of a VGA.

It is therefore an object of the invention to provide a variable gain amplifier comprising a first attenuator for receiving an input signal and for transmitting a first attenuated input signal to a first amplifier for amplifying the first attenuated input signal and for generating a first amplified signal to a second attenuator for attenuating the first amplified signal and for transmitting a second attenuated signal to a second amplifier for amplifying the second attenuated signal and for generating an output signal, wherein the first attenuator (1) is supplied from a first supply voltage source, the second attenuator is supplied from a second supply voltage source, the first amplifier is supplied from a third supply voltage source, and the second amplifier is supplied from a fourth supply voltage source. Using the above-architecture, the intermodulation noise generated if only a common supply source is used, is overcome and that improves the signal to noise ratio or noise figure of the circuit. In the system this is appreciated by improved ACPR (adjacent channel power ratio) which is a spectral purity measure that combines the effects of intermodulated non-linearity (OIP3) and intermodulated noise. Furthermore, because the attenuators are split, the noise figure of each attenuator can be dealt with separately: one in small signal e.g. the first attenuator and one in large signal e.g. the second attenuator.

In an embodiment of the invention, the first supply voltage source and the second supply voltage source provide a same voltage level. That determines that the attenuators provide the almost same noise and attenuation performances. However that does not necessary mean that the circuit comprises only one source for supplying the voltage level, but only that said voltages are substantially equal to each other.

In another embodiment, the third supply voltage source and the fourth supply voltage source provide a same voltage level. The reason for having that is the same as described in the previous paragraph.

In an embodiment, each of the first amplifier and the second amplifier comprises a respective first transistor and second transistor, each of the said transistors receiving a current generated by a respective current regulator. An input of the first amplifier is coupled to the output of the second amplifier via a feedback circuit and output of the amplifier.

Each of the current regulators comprises an error amplifier, the error amplifier being supplied from a fifth supply source.

In order to provide constant and predictable performance, the amplifiers should be supplied with an adaptable current which, according to the invention, is determined by an error amplifier, which is supplied from a different source. That determines a further noise decoupling of the error amplifiers from the noise generated by the first and the second amplifiers. The output of the error amplifiers can be a current or a voltage, depending what type of amplifier is driving.

In another embodiment of the invention, each attenuator comprises a respective plurality of attenuating cells, each cell comprising
a series resistor having a first terminal coupled to an attenuator input signal and a second terminal coupled to an attenuator output signal, the first terminal and the second terminal being coupled to a first Switch,
a first parallel resistor having a third terminal coupled to the first terminal of the series resistor and a fourth terminal coupled to a second switch,
a second parallel resistor having a fifth terminal coupled to the second terminal of the series resistor and a sixth terminal coupled to a third switch, wherein the first switch is controlled by a first control signal, the second switch and the third switch are controlled by a second control signal, the respective control signals being digital signals which in use are in different digital states.

The ratio between the first resistor and the second resistor determines the attenuation while the absolute values determine the input and the output impedance of each cell of the attenuators. When used in cascade, if the cells are identical the impedance matching is automatically achieved no matter how the attenuator cells are controlled.

In a further embodiment of the invention the VGA is integrated in a chip. Furthermore, the chip can be used in a power amplifier for a base station.

The invention is defined by the independent claims. Dependent claims define advantageous embodiments.

BRIEF DESCRIPTION OF THE DRAWINGS

The above and other advantages will be apparent from the exemplary description of the accompanying drawings in which.

DETAILED DESCRIPTION OF EMBODIMENTS

Figure 1:
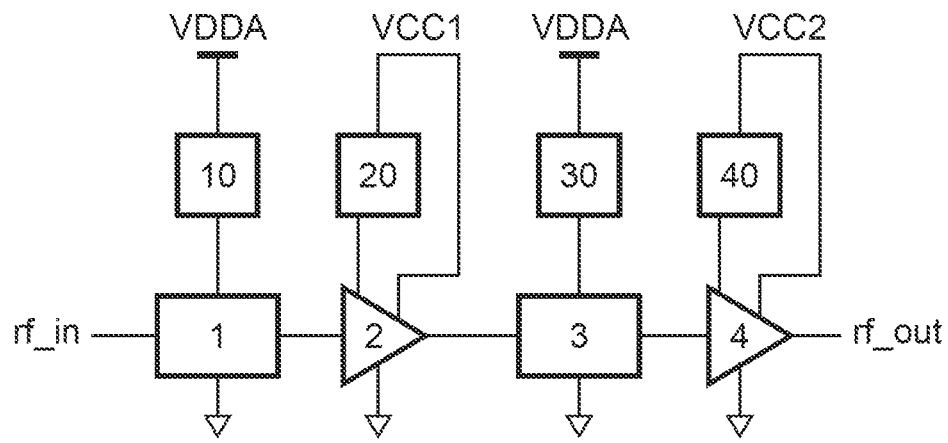
FIG. 1 depicts a variable gain amplifier, according to the invention.

FIG. 1 depicts a variable gain amplifier, according to the invention. The variable gain amplifier comprises a first attenuator 1 for receiving an input signal rf_in and for transmitting a first attenuated input signal to a first amplifier 2 for amplifying the first attenuated input signal and for generating a first amplified signal to a second attenuator 3 for attenuating the first amplified signal and for transmitting a second attenuated signal to a second amplifier 4 for amplifying the second attenuated signal and for generating an output signal rf_out. The first attenuator 1 is supplied from a first supply voltage source 10. The second attenuator 3 is supplied from a second supply voltage source 30. The first amplifier 2 is supplied from a third supply voltage source 20, and the second amplifier 4 is supplied from a fourth supply voltage source 40. Each of the voltage sources is provided by respective separate voltage regulators. The advantage of separating the supply voltages and regulators is to isolate the stages from crosstalk from one stage to another. Especially, separating the amplifiers from each other and from the attenuators prevents noise being added or mixed into the RF signal path.

Figure 2:
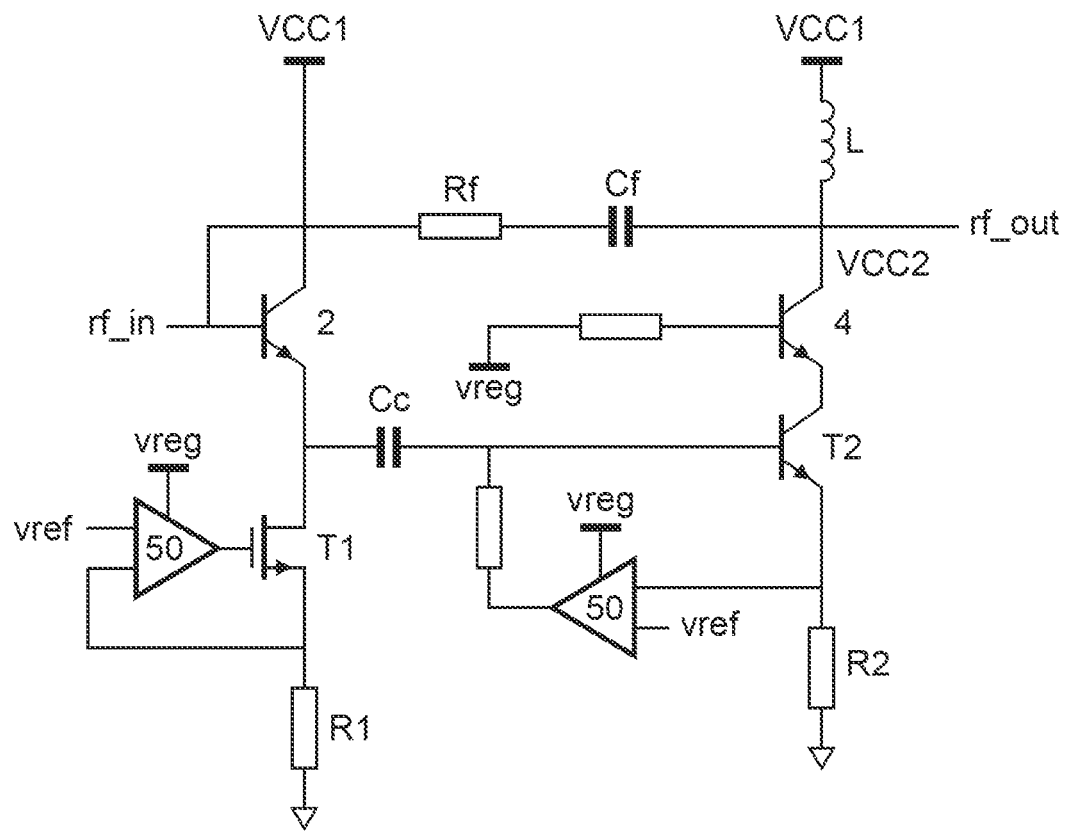
FIG. 2 depicts the first and the second amplifiers, according to an embodiment of the invention.

FIG. 2 depicts the first and the second amplifiers, according to an embodiment of the invention. Intentionally, the attenuators are not presented in this figure for not complicating it. The RF signal passes the transistors 2, T2 and 4 subsequently. Transistor 2 functions as a common-collector stage also known as an emitter follower. It is biased by a current source comprising T1, resistor R1 and an error amplifier 50. The emitter follower drives the output stage through the AC coupling capacitor Cc. The output stage constitutes of transistors T2 and 4. Transistor T2 functions as a common-emitter stage which is degenerated by resistor R2. Transistor T2 with R2 determines the voltage gain of the amplifier. Transistor 4 acts as a common-base stage also known as a cascode. The output of the amplifier is fed back to the input by resistor Rf and AC coupling capacitor Cf. This feedback improves linearity of the amplifier and provides impedance matching at input and output. Biasing of the output stage T2 and 4 is handled by the error amplifier 50 which basically copies the reference voltage Vref across the degeneration resistor R2 thereby fixing the current. It is appreciated that the current sources for both the emitter follower and the output stage use a reference voltage Vref and an error amplifier to generate a constant current. Furthermore, this constant current can be easily adjusted by means of adjustment of Vref, which can be a different voltage either for the emitter follower versus the output stage, or the first or second amplifier. This feature can be exploited to trade-off current consumption of the amplifiers with linearity. For example as discussed before, when the VGA is around its maximum gain states the linearity is not very dependent on amplifier 2 and consequently its current can be reduced without penalty for the system ACPR performance. Alternatively, when the VGA is around its maximum attenuation states the linearity is not very dependent on amplifier 4 and consequently its current can be reduced. (Question: can we put this feature in one of the dependent claims?). Bipolar and field-effect transistor are drawn in FIG. 2, but the skilled person in the art would contemplate other possible combinations, too. The power transistor 4 is further supplied from a separate supply voltage vreg and further decoupled from the general supply pin VCC1 via an inductor, for further improving the filtering of the spurious signals that may deteriorate its performance. The supply current in maintained relatively constant with an error amplifier 50, which is supplied from a separate voltage, too. Its output can be either a voltage as e.g. when controlling the Field effect transistor T1 or a current when it controls the bipolar transistor T2.

Figure 3:
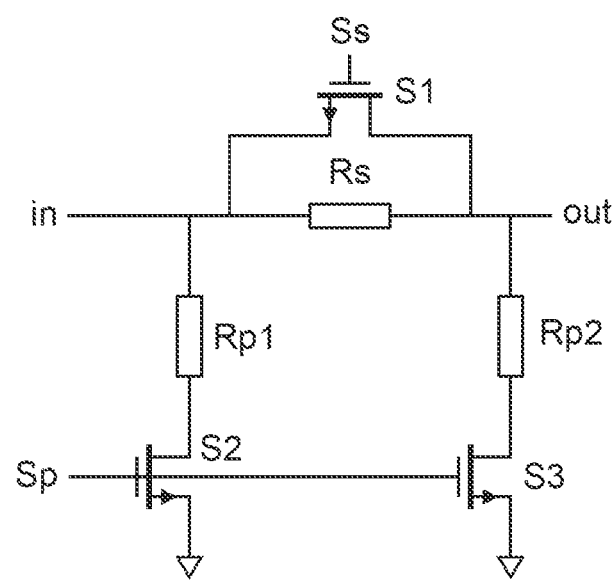
FIG. 3 depicts a cell of the attenuators, according to an embodiment of the invention.

FIG. 3 depicts a cell of the attenuators, according to an embodiment of the invention. Each cell comprises a series resistor Rs having a first terminal coupled to an attenuator input signal in and a second terminal coupled to an attenuator output signal out, the first terminal and the second terminal being coupled to a first Switch S1. The cell further comprises a first parallel resistor RP1 having a third terminal coupled to the first terminal of the series resistor Rs and a fourth terminal coupled to a second switch S2. The cell further comprises a second parallel resistor Rp2 having a fifth terminal coupled to the second terminal of the series resistor Rs and a sixth terminal coupled to a third switch S3, wherein the first switch S1 is controlled by a first control signal Ss, the second switch S2 and the third switch S3 are controlled by a second control signal Sp, the respective control signals being digital signals which in use are in different digital states. In a usual implementation, the parallel resistors are equal to each other.

If Ss signal is high i.e. the switch S1 is ON and Sp is low i.e. the switches S2 and S3 are both OFF, then the cell is not attenuating, but passing the signal with as little insertion loss as possible from input to the output. If Ss is low i.e. the switch is OFF and Sp is high i.e. the switches S2 and S3 are both ON, then the cell is attenuating. It should be mentioned here that the switches shown in FIG. 3 are implemented using n channel MOS transistor, but the skilled person in the art may implement them as bipolar or p-type MOS transistors taking care to adapt the control signals, accordingly. The amount of attenuation is dependent on the ratio of the series impedance Rs and the parallel impedance Rp. The required impedance level at input and output for matching determines the absolute value of the impedances. For example, a 4 dB attenuation at 50 Ohm can be achieved by 24 Ohm series impedance and 220 Ohm parallel impedance. The advantages of these attenuation sections are that

- they do not need current—really zero quiescent current of the cell itself;
- their attenuation is decoupled from current consumption;
- they are highly linear;
- they have large bandwidth;
- they easily match to external impedance, like 50 Ohm, and equally for input and output because of symmetry, thereby being inherently modular.

Figure 4:
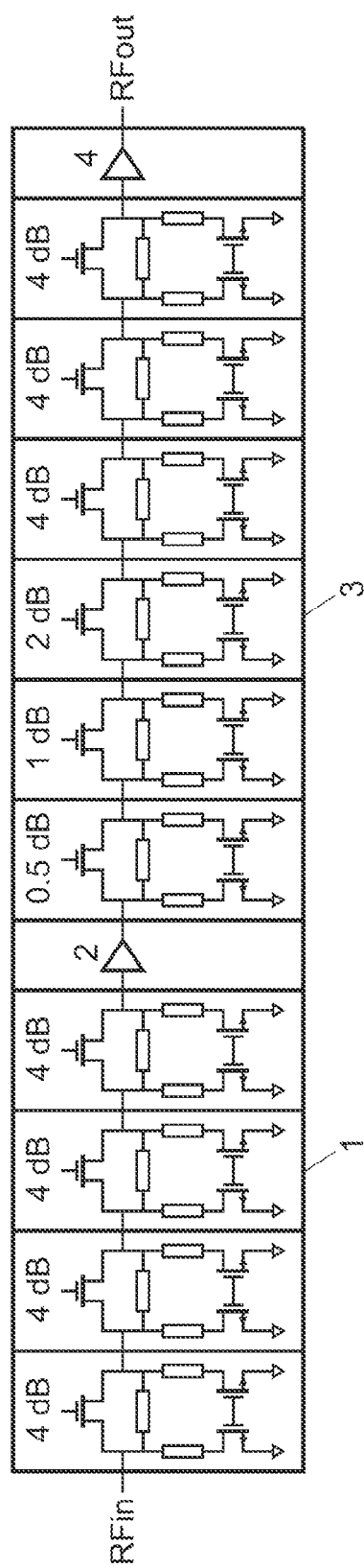
FIG. 4 depicts an overall view of the variable gain amplifier, according to an embodiment of the invention.

FIG. 4 depicts an overall view of the variable gain amplifier, according to an embodiment of the invention. It comprises a first plurality of attenuating cells in both first and second attenuators. The advantage is that each cell in said pluralities can be trimmed separately for determining a specific insertion loss and for keeping, at the same time, the impedance adaptation with the other cells in the pluralities on one hand and between the cells and the amplifiers on the other hand. When compare FIG. 1 and FIG. 4, one can observe that the attenuator 1 in FIG. 1 comprises four cascaded 4 dB cells in FIG. 4. Attenuator 3 in FIG. 1 comprises 6 cascaded cells in FIG. 4 with attenuation 0.5 dB, 1 dB, 2 dB and (three times) 4 dB. For optimal noise performance of the variable gain amplifier (VGA) the control of these attenuator cells is very important. In order not to adversely impact the noise figure of the VGA, attenuation—starting at maximum gain—will commence in attenuator 3. This explains why the smallest cell attenuation, (0.5 dB in FIG. 4 is situated in attenuator 3 preceding the large-signal amplifier 4. Consequently in the embodiment of FIG. 4 the first 15.5 dB attenuation (0.5+1+2+4+4+4) is achieved by attenuator 3. For optimal linearity the last 16 dB attenuation (4+4+4+4) is placed before the small-signal amplifier 2. To minimally impact the noise performance, the smallest attenuator cells (0.5, 1 and 2 dB) of attenuator 3 are reused also for the last 16 dB attenuation range (total attenuation range is 31.5 dB). As a consequence, a smaller number of cells in cascade are required which yields minimal insertion loss and thereby minimal noise figure. It is noted that this way of controlling and implementing the attenuator cells provides for an advantage when the VGA is integrated in a chip. The attenuation of each cell can be modified separately determining a great flexibility in choosing the number of cells used in a specific situation i.e. the attenuation.

Figure 5:
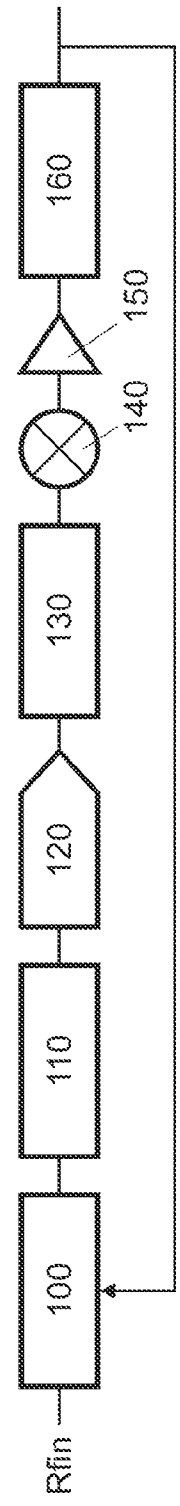
FIG. 5 depicts a schematic of a transmitter for a base station comprising a variable gain amplifier, according to the invention.

FIG. 5 depicts a schematic of a transmitter for a base station comprising a variable gain amplifier, according to the invention.

The main function of the RF transmit VGA 150 is to control the output power at the antenna connector. Gain control can be triggered either by aging of the power stage or due to traffic variation in the cell such as day and night traffic differences. Fine gain steps are required since the cell traffic varies slightly over time, operator is required to keep the output power level constant. If this is not the case the cell size will shrink. The latter is allowed since it reduces cell throughput which results in dropped calls. Final stage aging happens due to the high output powers, for instance 80 W RMS and 900 W peak. As this happens continuously the gain of the power amplifier 160 transistor starts to reduce. This needs to be compensated by the VGA 150. Again fine step sizes are required since small degradation over time is expected. Also in this case the cell size is reduced and less coverage is the result which the operator has to compensate for. Often digital gain control is preferred upon analog control.

The transmitter comprises a transmitter signal processing unit 100 for up-converting the input signal Rfin, for filtering etc. The output signal of the transmitter signal processing unit 100 is further processed in 110 for determining an intermediate frequency signal which is digital to analog converted by the D/A converter 120 and then the output of the D/A converter is low pass filtered in the low pass filter 130. The signal generated by the low pass filter is then mixed with an oscillator signal in the mixer 140 and the resulting up-converted signal is applied to the variable gain amplifier 150. The output signal of the variable gain amplifier 150 is further applied to a power amplifier 160 that generates the high power signal of the transmitter. At the same time, a feedback from the power amplifier output to the transmitter signal processing unit 100 is provided, too for digital pre-distorsion.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A variable gain amplifier comprising:
a first attenuator for receiving an input signal and for transmitting a first attenuated input signal to
a first amplifier for amplifying the first attenuated input signal and for generating a first amplified signal to
a second attenuator for attenuating the first amplified signal and for transmitting a second attenuated signal to a
second amplifier for amplifying the second attenuated signal and for generating an output signal,
wherein,
the first attenuator is supplied from a first supply voltage source,
the second attenuator is supplied from a second supply voltage source,
the first amplifier is supplied from a third supply voltage source, and
the second amplifier is supplied from a fourth supply voltage source.

2. A variable gain amplifier as in claim 1, wherein the first supply voltage source and the second supply voltage source provide a same voltage level.

3. A variable gain amplifier as in claim 1, wherein the third supply voltage source and the fourth supply voltage source provide a same voltage level.

4. A variable gain amplifier as in claim 1, wherein each of the first amplifier and the second amplifier comprises a respective first transistor and second transistor, each of said transistors receiving a current generated by a respective current regulator.

5. A variable gain amplifier as in claim 4, wherein an input of the first amplifier is coupled to an output of the second amplifier via a feedback circuit.

6. A variable gain amplifier as in claim 4, wherein each of the current regulators comprises an error amplifier, the error amplifier being supplied from a fifth supply source.

7. A variable gain amplifier as in claim 1, wherein each attenuator comprises a respective plurality of attenuating cells, each cell comprising:
a series resistor having a first terminal coupled to an attenuator input signal and a second terminal coupled to an attenuator output signal, the first terminal and the second terminal being coupled to a first Switch,
a first parallel resistor having a third terminal coupled to the first terminal of the series resistor and a fourth terminal coupled to a second switch; and
a second parallel resistor having a fifth terminal coupled to the second terminal of the series resistor and a sixth terminal coupled to a third switch, wherein the first switch is controlled by a first control signal, the second switch and the third switch are controlled by a second control signal, the respective control signals being binary signals which in use are in different binary states.

8. An integrated circuit comprising a variable gain amplifier as in claim 1.

9. A power amplifying system comprising a variable gain amplifier as in claim 1.

* * * * *

UNITED STATES PATENT AND TRADEMARK OFFICE
CERTIFICATE OF CORRECTION

| | | |
|---|---|---|
| PATENT NO. | : 8,471,637 B2 | Page 1 of 1 |
| APPLICATION NO. | : 13/368372 | |
| DATED | : June 25, 2013 | |
| INVENTOR(S) | : Gian Hoogzaad | |

It is certified that error appears in the above-identified patent and that said Letters Patent is hereby corrected as shown below:

In the Specification

In column 4, lines 13-14, delete "(Question: can we put this feature in one of the dependent claims?)."

Signed and Sealed this
Twenty-eighth Day of January, 2014

Michelle K. Lee
*Deputy Director of the United States Patent and Trademark Office*